(12) United States Patent
Blackwood

(10) Patent No.: US 6,847,123 B2
(45) Date of Patent: Jan. 25, 2005

(54) VERTICALLY STAGGERED BONDPAD ARRAY

(75) Inventor: Jeff Blackwood, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/114,144

(22) Filed: Apr. 2, 2002

(65) Prior Publication Data

US 2003/0183953 A1 Oct. 2, 2003

(51) Int. Cl.$^7$ .............. H01L 29/40; H01L 23/053; H01L 23/12; H01L 23/48; H01L 23/52
(52) U.S. Cl. ............. 257/786; 257/773; 257/738; 257/700; 257/692; 257/690
(58) Field of Search ............... 257/786, 738, 257/737, 773, 690, 692, 700, 784, 723, 724, 777, 7

(56) References Cited

U.S. PATENT DOCUMENTS

| | | | | |
|---|---|---|---|---|
| 5,627,408 A | * | 5/1997 | Kusumi | 257/784 |
| 5,734,559 A | * | 3/1998 | Banerjee et al. | 361/761 |
| 6,214,638 B1 | * | 4/2001 | Banerjee | 438/106 |
| 6,329,827 B1 | * | 12/2001 | Beaman et al. | 324/754 |
| 6,661,101 B2 | * | 12/2003 | Hiraga | 257/786 |

* cited by examiner

Primary Examiner—Nathan J. Flynn
Assistant Examiner—Victor A. Mandala, Jr.
(74) Attorney, Agent, or Firm—Trexler, Bushnell, Giangiorgi & Blackstone, LTD

(57) ABSTRACT

A silicon device which includes a silicon substrate and a bond pad array on the silicon substrate which is configured to be conductively connected to bond wire. The bond pad array consists of a plurality of bond pads which are vertically staggered on the silicon substrate. The vertical staggering allows the bond pads to be packed closer together on the silicon substrate, thereby reducing the horizontal space which is consumed by the bond pads on the silicon substrate, and thereby resulting in a reduction in die size. Preferably, the bond pads are also horizontally staggered on the silicon substrate, thereby allowing the bond pads to be spaced even closer together.

6 Claims, 1 Drawing Sheet

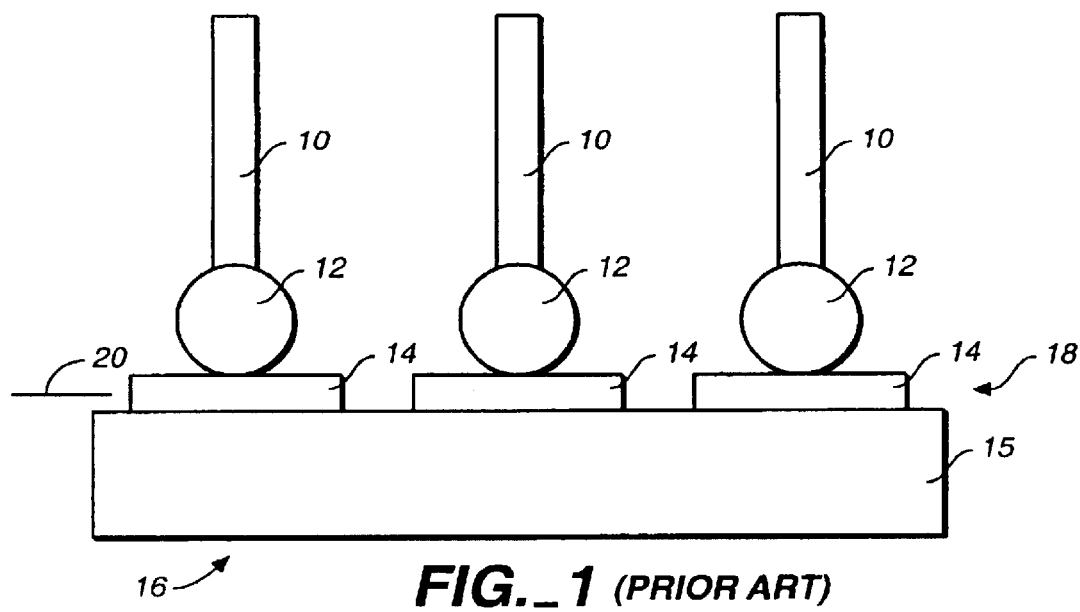
FIG._1 (PRIOR ART)
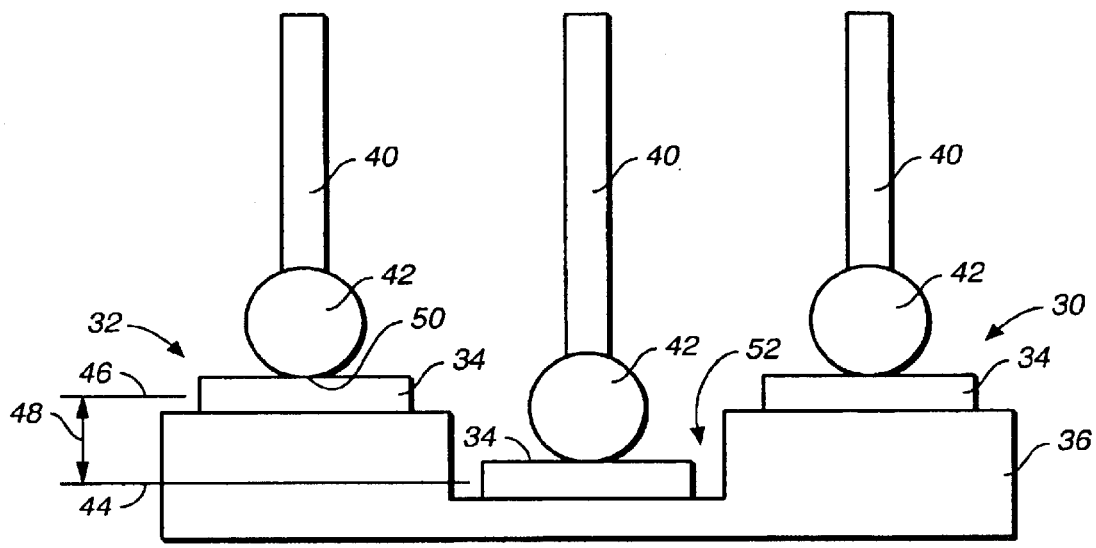
FIG._2
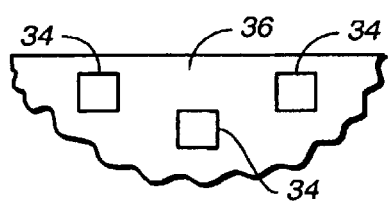
FIG._3

VERTICALLY STAGGERED BONDPAD ARRAY

BACKGROUND

The present invention generally relates to bondpad arrays, and more specifically relates to a bondpad array which is vertically staggered, thereby providing that die size can be reduced.

One of the driving factors in development of new process technologies is the reduction of die size, allowing more die to be manufactured in a given surface area. Increases in semiconductor device capabilities, integration, and technology result in increasing chip functionality. This often results in a device which includes a large number of Input/Output (I/O) pins to the device. The interface between the silicon device and the package typically consists of a metallic bond pad (BP) on the silicon chip to which a bond wire conductor is attached. This wire conductor is attached to the device package, which serves as the device interface to the electrical environment outside the package. This connection is usually made at the top metal layer of the chip.

The bond wire-to-bond-pad region (often referred to as the "ball bond") has a physical size minimum beyond which the device becomes physically unmanufacturable. At a certain point, the size of the die becomes constrained by the number of I/O pins of the device. The area required for the internal circuitry of the device is smaller than the area around the perimeter of the circuitry required for a high number of I/O pins, bond pads, and their associated bond wires.

The current methodology for minimizing the space required for I/O connections involves horizontally staggering the bond pads. This technique significantly reduces the space required along the side of the device for I/O connections. As illustrated in FIG. 1, bond wires 10 terminate at ball bonds 12, and the ball bonds 12 are bonded to bond pads 14 which are located on a silicon substrate 15 of the device 16. As shown, even when bond pads 14 are horizontally staggered, all the bond pad connections are made at the top metal layer 18 of the device 16 (i.e., all the connections are made on the same plane 20). Certain horizontal minimum-space rules are required between adjacent bond pads 14 in order to prevent electrical contact between adjacent ball bonds 12.

While horizontally staggering the bond pads on a device reduces the space required along the side of the device for I/O connections, it is desirable to devise ways to even further reduce the space which is required along the side of a device for I/O connections.

Flip-Chip bond pad methodology places the bond pad on the surface of the die covering the active area of the circuitry. This eliminates the need for space allotment along the edge of the die for I/O purposes, however there are many drawbacks to this technique. Flip-Chip methodology requires additional processing steps adding much cost and complexity to manufacturing. It also severely impacts failure-analysis and debugging, resulting in much costlier and higher cycle times for yield improvement efforts.

OBJECTS AND SUMMARY

A general object of an embodiment of the present invention is to provide a silicon device which has a bond pad array which is vertically staggered.

Another object of an embodiment of the present invention is to provide a silicon device which has a bond pad array which is both vertically and horizontally staggered.

Briefly, and in accordance with at least one of the forgoing objects, an embodiment of the present invention provides a silicon device which includes a silicon substrate and a bond pad array on the silicon substrate which is configured to be conductively connected to bond wire. The bond pad array consists of a plurality of bond pads which are vertically staggered on the silicon substrate. The vertical staggering allows the bond pads to be packed closer together on the silicon substrate, thereby reducing the horizontal space which is consumed by the bond pads on the silicon substrate, and thereby resulting in a reduction in die size. Preferably, the bond pads are also horizontally staggered on the silicon substrate, thereby allowing the bond pads to be spaced even closer together.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which:

FIG. 1 is an enlarged, cross-sectional view of a typical bond wire/bond pad arrangement;

FIG. 2 is an enlarged, cross-sectional view of a bond wire/bond pad arrangement which is in accordance with the present invention, wherein the bond pads on a silicon device are vertically staggered; and FIG. 3 is a top view showing horizontal staggering of the bond pads shown in FIG. 2.

DESCRIPTION

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

FIG. 2 illustrates a device 30 which includes a bond pad array 32 which is in accordance with an embodiment of the present invention. The bond pad array 32 includes a plurality of bond pads 34 which are vertically staggered with relation to each other. The vertical staggering provides that the bond pads 34 can be packed closer together on a silicon substrate 36, thereby reducing the horizontal space which is consumed by the bond pads 34, and thereby resulting in a reduction in die size. Furthermore, the bond pads 34 may be horizontally staggered on the silicon substrate 36 as shown in FIG. 3, thereby allowing the bond pads 34 to be spaced even closer together.

As shown in FIG. 2, bond wires 40 terminate at ball bonds 42 and, when the device 30 is connected, the ball bonds 42 are bonded to the bond pads 34 which are located on the silicon substrate 36 of the device 30. The bond pads 34 are vertically staggered at different metal layers such that the ball bond connections are made on a plurality of different planes 44 and 46. Current technology results in bond pads with X and Y sizes on the order of approximately 75 microns. The bond pads 34 may be vertically staggered such that the planes 44 and 46 are approximately 5 to 10 microns apart (dimension 48 in FIG. 2), depending on the metal layers used in the staggering process.

Contrary to the depiction shown in FIGS. 1 and 2, the cross-sectional profile of a typical ball bond 42 (12 in FIG.

1) is not spherical. A "shoulder" is usually formed several microns above the interface 50 between the ball bond 42 and bond pad 34. By reducing the bond pad 34 size (as compared to the bond pads 14 shown in FIG. 1), and confining ball bonds (such as the middle ball bond 42 shown in FIG. 2) in cavities 52 (one is shown in FIG. 2) formed by a recessed lower-layer bond pad (i.e., the middle bond pad 34 shown in FIG. 2), the horizontal physical requirements for bond pad size are reduced dramatically, on the order of several tens of percent.

As shown in FIG. 3, the bond pads 34 are also preferably horizontally staggered to allow tighter spacing. Vertically staggering bond pads as shown in FIG. 2 allows even further tighter spacing of horizontal staggered bond pads 34, resulting in further die size reduction.

Assuming a confined ball bond diameter of approximately 60 microns, vertically staggering the bond pads 34 can provide for a size reduction of 20% over a typical flat-bond pad arrangement (i.e., over a bond pad arrangement wherein all the bond pads 14 are on the same plane 20, as shown in FIG. 1). This allows a 40% reduction in I/O space-driven die size requirements.

Making a device which has vertically staggered bond pads could be implemented with minimal effort, using current process technology, with a minimum of additional processing steps. Bond-wire placement would be semi-self-aligning on the recessed bond pads (i.e., on those bond pads which are on a lower plane on the device).

While an embodiment of the present invention is shown and described, it is envisioned that those skilled in the art may devise various modifications of the present invention without departing from the spirit and scope of the appended claims.

What is claimed is:

1. A silicon device comprising: a silicon substrate; and a bond pad array on the silicon substrate, said bond pad array configured to be conductively connected to bond wire, said bond pad array comprising a first bond pad disposed on a first plane, a second bond pad disposed on a second plane, and a third bond pad disposed on a third plane, said second bond pad being disposed between said first band pad and said third bond pad, said second plane being lower than said first plane and said third plane, wherein said second bond pad is lower than, yet is disposed between, said first bond pad and said third bond pad, wherein said first and third bond pads are horizontally linearly aligned, parallel to an edge of the silicon substrate, and are vertically aligned, said second bond pad being both horizontally and vertically staggered with regard to said first and second bond pads.

2. A silicon device as claimed in claim 1, wherein the vertical staggering allows the bond pads to be packed closer together on the silicon substrate, thereby reducing horizontal space which is consumed by the bond pads on the silicon substrate, and thereby resulting in a reduction in die size.

3. A silicon device as claimed in claim 1, wherein at least one of the bond pads is disposed in a cavity on the silicon substrate.

4. A silicon device comprising: a silicon substrate; a bond pad array on the silicon substrate; bond wire; ball bonds conductively connected to the bond wire; said bond pads being conductively connected to the ball bonds, said bond pad array comprising a first bond pad disposed on a first plane, a second bond pad disposed on a second plane, and a third bond pad disposed on a third plane, said second bond pad being disposed between said first bond pad and said third bond pad, said second plane being lower than said first plane and said third plane, wherein said second bond pad is lower than, yet is disposed between, said first bond pad and said third bond pad, wherein said first and third bond pads are horizontally linearly aligned, parallel to an edge of the silicon substrate, and are vertically aligned, said second bond pad being both horizontally and vertically staggered with regard to said first and second bond pads.

5. A silicon device as claimed in claim 4, wherein the vertical staggering allows the bond pads to be packed closer together on the silicon substrate, thereby reducing horizontal space which is consumed by the bond pads on the silicon substrate, and thereby resulting in a reduction in die size.

6. A silicon device as claimed in claim 4, wherein at least one of the bond pads is disposed in a cavity on the silicon substrate.

* * * * *